United States Patent [19]

Waldner

[11] Patent Number: 4,627,159
[45] Date of Patent: Dec. 9, 1986

[54] APPARATUS AND METHOD FOR PROCESSING A SEMICONDUCTOR LEAD FRAME

[76] Inventor: Kurt Waldner, 12260 Saraglen Dr., Saratoga, Calif. 95170

[21] Appl. No.: 656,818

[22] Filed: Oct. 1, 1984

[51] Int. Cl.⁴ .............................................. H01R 43/00
[52] U.S. Cl. ......................................... 29/827; 72/427
[58] Field of Search ...................... 29/827, 588, 564.6, 29/564.7; 72/421, 429, 427; 357/70

[56] References Cited

U.S. PATENT DOCUMENTS

3,364,723  1/1968  Gartside ............................ 72/427 X
4,409,733 10/1983  Alemanni ............................. 29/827

Primary Examiner—Howard N. Goldberg
Assistant Examiner—Carl J. Arbes
Attorney, Agent, or Firm—Townsend and Townsend

[57] ABSTRACT

Apparatus and a method for processing a semiconductor lead frame, such as deflashing a plurality of molded chip housings on the lead frame as they move along a predetermined path. A support has a pair of sides, and a track on each side respectively, one track guides lead frames upwardly in a first stack to a position laterally aligned with a die on a vertically movable die plate. The other track receives processed lead frames and allows the processed lead frames to be lowered in a second stack. A reciprocal shuttle member extending between said tracks strips off the uppermost lead frame from the first stack and moves it into a position beneath the die which is then lowered by a power device sequentially to process, i.e., deflash, the lead frame. Then, the die elevates, allowing the shuttle member to reverse so that it can pick up the top lead frame from the first stack to advance it along with the processed lead frame laterally, the processed lead frame being movable onto the second stack. The power device includes a tubular coil having an open end for receiving a magnetic core secured to the die plate. When a signal energizes the coil, a magnetic force attracts the core into the coil member, moving the die plate downwardly. A spring biases the die plate upwardly.

16 Claims, 14 Drawing Figures

APPARATUS AND METHOD FOR PROCESSING A SEMICONDUCTOR LEAD FRAME

This invention relates to improvements in the production of semiconductor lead frames and, more particularly, to an apparatus and method for processing semiconductor lead frames, such as deflashing the molded chip housings thereon.

BACKGROUND OF THE INVENTION

In the formation of semiconductor lead frames for mounting integrated circuit chips, the chips are bonded to pads on lead frames and after lead wires are bonded to the chip terminals and the proper leads of the frame, the chips and lead wires are encapsulated in a housing by a molding operation. Following the molding operation, the lead frame is directed through another machine where portions of the frame, known as dam bars, are punched outwardly and thereby removed. These dam bars are provided initially for supporting the leads of the frame as the frame is produced, yet the dam bars must be removed to electrically isolate the frame leads from each other. The dam bars are directed through a die machine where the dam bars are punched out of the frame.

In the molding step for encapsulating the chips on the frame, small lateral projections on the sides of the molded housings are formed, these projections being identified as flashing. These projections become a problem when the lead frame is subjected to the the dam bars therefrom. These flashed projections form particles which accumulate in the die machine for removing the dam bars and eventually jam the machine, eventually making it substantially impossible to operate the die machine. Thus, it is important for uninterrupted production of lead frames to minimize or eliminate this problem if at all possible.

Attempts in the past to eliminate the flashing projections have been made but have not been satisfactory for one or more reasons. Generally, the apparatus for accomplishing this purpose has been massive in size, requires a considerable amount of space, and is hydraulically or pneumatically driven, thereby giving rise to loud noises in the operation of the apparatus. Also, the capital equipment costs for conventional apparatus of this type is extremely high so that the protection costs of lead frame is correspondingly great.

Because of the foregoing drawbacks, a need exists for improvements in the means and techniques for removing the flashing from lead frames before the lead frames are subjected to a dye cutting operation to remove the dam bars therefrom. The present invention satisfies this need.

SUMMARY OF THE INVENTION

The present invention is directed to the processing of semiconductor lead frames in a manner such that a plurality of lead frames can be quickly and easily processed by apparatus which requires only a minimum amount of space and can be operated efficiently with minimum power requirements yet without sacrificing the high reliability required to obtain a high processing yield. To this end, the apparatus of the invention includes an upright support having a pair of sides along which first and second stacks, respectively, of lead frames can move. On one side, the first stack of lead frames moves incrementally upwardly to a position laterally aligned with a processing zone defined by upper and lower dies and a shiftable die plate coupled with the upper die for up and down movement of the upper die with respect to the lower die. When the upper die moves downwardly under the influence of the upper die plate, a semiconductor lead frame between the dies is processed, such as being deflashed, then the processed lead frame is moved out of the die processing zone to the top of the second stack where it gravitates into the stack. During the time the previously processed lead frame is moved laterally, the topmost lead frame from the first stack is shifted into position between the die and the processing is repeated. In this way, a plurality of semiconductor lead frames from a stack can be processed in a minimum of time with high reliability and at low capital equipment costs.

An important feature of the present invention is the shuttle member which advances and retracts relative to the dies of the apparatus. The shuttle member is comprised of a plurality of parallel shuttle bars which have notches on the lower faces thereof and these notches are used to advance the lead frames one by one in a forward direction yet the notches allow the bars to be reversed and moved back so that the uppermost lead frame of the first stack can be stripped off the stack and moved into a position beneath the upper die. Each bar of the shuttle member is pivotally mounted and is raised at the downstream end thereof relative to its upstream end so that, during retraction, the bar does not engage the semiconductor components and thereby there is no scratching of such components as would otherwise occur if the bars were rigid and allowed to reverse without being lifted.

Another aspect of the present invention is the use of an improved power means in combination with the upper die plate and the support. The power means includes a coil member having a recess therein and an open top for receiving a magnetic core or armature rigid to and depending from the upper die plate. When a signal is received by the coil member, a magnetic force is generated which attracts the core and pulls the upper die plate downwardly.

Means is provided to bias the upper die plate upwardly so that it is returned to its normal uppermost equilibrium position after the magnetic force is removed. Also, a damping unit is mounted on the support and engages the upper die plate to damp out the vibrations of the upper die plate as it returns to its normal uppermost equilibrium position. The damping of the vibrations allows the upper die to be immediately ready for the next downward stroke and thereby increases the production rate at which semiconductor lead frames can be processed by the apparatus of the present invention.

The primary object of the present invention is to provide apparatus and method for processing semiconductor lead frames, wherein a plurality of lead frames can be processed in a minimum of time with a minimum expenditure for capital equipment yet the yield of the lead frames will remain relatively high to permit the production cost of the lead frames to remain relatively low without sacrificing reliability.

Other objects of this invention will become apparent as the following specification progresses, reference being had to the accompanying drawings for an illustration of the invention.

IN THE DRAWINGS

FIG. 4b is a schematic view of the semiconductor lead frames as they move upwardly in a first stack, move laterally beneath a die of the type having a blade of the type shown in FIG. 4, and then downwardly in a second stack;

Apparatus 10 includes an upright support 12 which is adapted to be placed on a floor. The support 12 has an upper surface 14 on which die unit 16 is placed. The die unit is adapted, for purposes of illustration, to deflash a workpiece 18 of the type shown in FIG. 3. For purposes of illustration, the workpiece is a semiconductor lead frame having a series of molded housings 20 interconnected by leads 22. Each housing 20 has lateral projections 24 which are to be deflashed by the operation of die unit 16 as hereinafter described. The die unit operates to shear off projections 24 from each housing 20, respectively, so that the sides of each housing 20 are left free of such projections 24.

Figures 4, 4A:
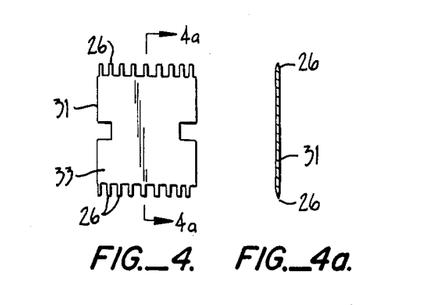
FIG. 4 is a side elevational view of the die element for deflashing the semiconductor lead frame of FIG. 3.
FIG. 4a is a cross sectional view taken along line 4a—4a of FIG. 4.
Figure 6:
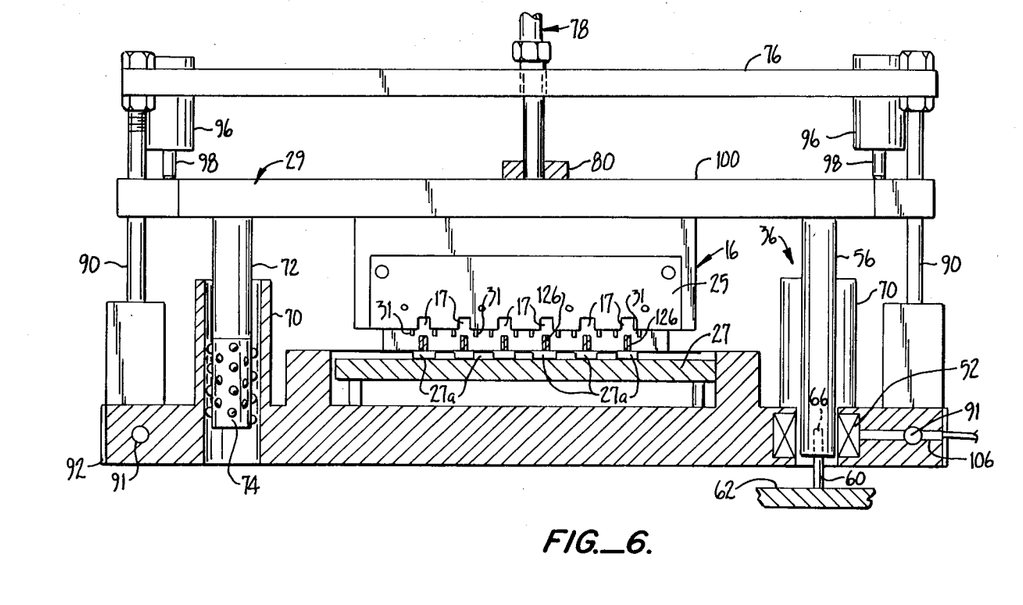
FIG. 6 is a vertical section of the apparatus, looking from one side thereof.

Die unit 16 has an upper die 25 and a lower die 27, upper die 25 being secured to the lower surface of a vertically shiftable upper die plate 29. Upper die 25 has a plurality of elongated grooves 17 in the lower face thereof and the a plurality of deflashing blades 31 of the type shown in FIGS. 4 and 4a are attached to the lower face of upper die-25 as shown in FIG. 6 on opposite sides of respective grooves 17. Each blade 31 has a rigid, plate-like body 33 provided with teeth 26 thereon which are spaced apart by a distance equal to the spacing of projections 24. As the teeth 26 of blades 31 engage projections 24, they shear off the projections, and the projections fall freely and can be thereafter blown away from apparatus 10 by air under pressure.

Each groove 17 in upper die-25 is vertically aligned with a corresponding grooves 27a in lower die-27 as shown in FIG. 6. Grooves 27a are adapted to receive and guide the housings 20 of a lead frame 18 as the latter moves from a first vertical stack 28 of lead frames 18 to a second vertical stack 38 of lead frames 18 as hereinafter described.

Figure 3:
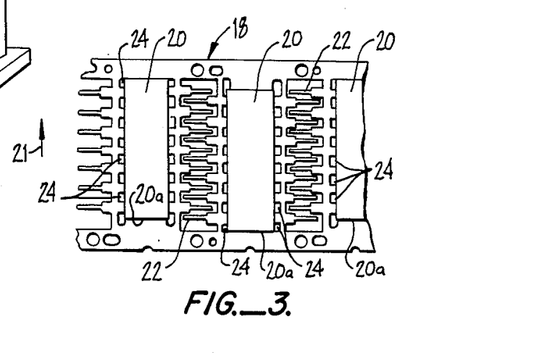
FIG. 3 is an enlarged, fragmentary top plan view of a semiconductor lead frame which is processed by the apparatus of the present invention.
Figure 3A:
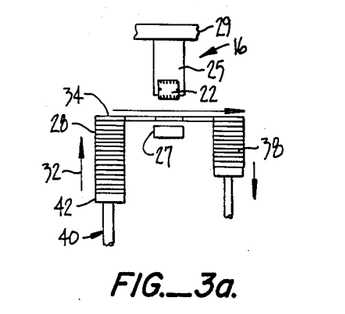

FIG. 3a shows schematically the way in which a plurality of lead frames 18 are moved into and through apparatus 10 for deflashing. In a vertical stack 28, a plurality of lead frames 18 are mounted adjacent to one side 30 of support 12 and are lifted incrementally in the direction of arrow 32 to an upper level denoted by the numeral 34. Then, the parallel bars 126 (FIG. 6) of a shuttle member 34, hereinafter described, will shift the uppermost lead frame 18 in stack 28 laterally and into a position between dies 25 and 27 underlying a plurality of blades 31. A power means 36 will cause the upper die 25 and thereby blades 31 to descend and to deflash the lead frame, i.e., remove projections 24 therefrom. Bars 126 are in vertical alignment with respective grooves 17 and 27a so that the bars 126 enter respective grooves 17 when the upper die-25 is lowered. Thus the shuttle member remains between upper die-25 and lower die-27 when the deflashing of the lead frame between the dies occurs. Then the shuttle bar will advance the lead frame to a position overlying a second vertical stack 38 of lead frames adjacent to the opposite side of support 12, and the deflashed lead frame will fall onto the stack and the stack will progressively and incrementally descend until all of the lead frames initially in stack 28 have been deflashed and are in the stack 38. Then the stack 38 can be removed and taken to another location for further processing of the lead frames, such as removing the dam bars on the leads 22 of the lead frames 18.

Figure 7:
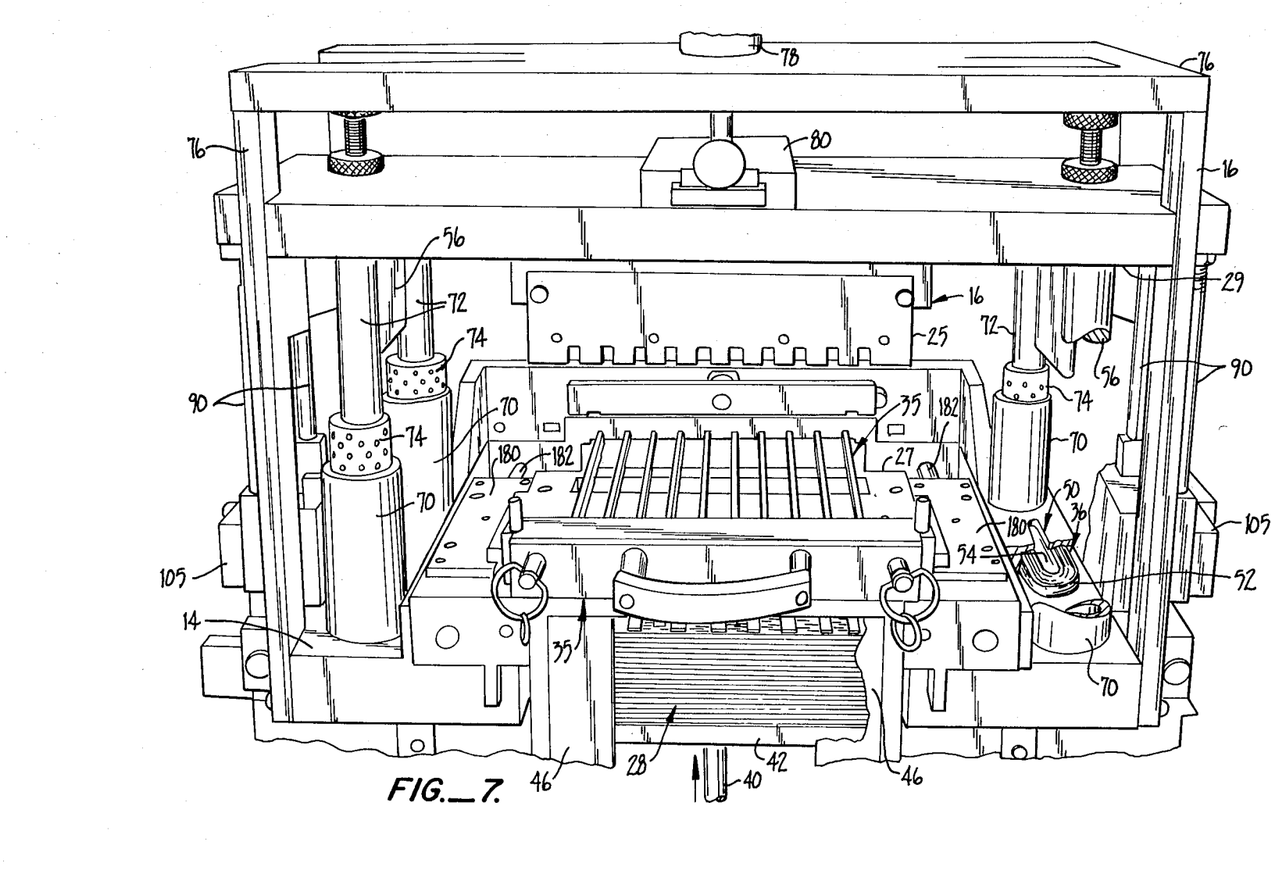
FIG. 7 is a perspective view of the upper portion of the apparatus, showing the shuttle member for shifting semiconductor lead frames past and between an upper die and a lower die.

The mechanism for raising the stack 28 of lead frames 18 includes a fluid piston and cylinder assembly 40 having a bar 42 at the upper end of the piston, the bar 42 being adapted to engage the bottom of the stack 28. For purposes of illustration, a stack of lead frames is placed in a ladder which is defined by a pair of transversely C-shaped side rails 46 (FIG. 1) which are removably mounted as a unit and placed adjacent to side 30 of support 12. Piston bar 42 as shown in FIG. 7 moves into the ladder 44 and incrementally raises the stack 28 of lead frames 18 until the stack has been depleted. The opposite side of support 12 will have a similar removable ladder which receives a piston bar in the same manner shown in FIG. 7 yet the piston bar moves incrementally downwardly instead of upwardly in the case of the piston bar adjacent to the side 30 of support 12.

Power means 36 (FIG. 7) includes a pair of power devices 50 which are mounted on the upper surface of the support 12, each power device 50 being of substantially the same construction so that a description of one will suffice for a description of the other.

Each power device 50 is a magnetically actuated unit which includes a coil member 52 having an open top recess 54 for receiving the lower part of an armature or magnetic core 56 which is rigidly secured to and extends downwardly from upper die plate 29 which is mounted for up and down movement on support 12 in a manner hereinafter described. A signal applied to the coil of coil member 52 will generate a magnetic force which will pull, by magnetic attraction, the core 56 downwardly and into the recess 54, thereby pulling upper die plate 29 downwardly to cause the blades 22 to move into deflashing relationship with projections 24 of the lead frame 18 directly below the blades and between upper and lower dies 25 and 27.

Each armature 56 has a spring biased rod 60 (FIG. 6) which projects downwardly from the lower end of core 56 and is adapted to engage a suitable lower surface 62 of support 12. The rod is in a bore which contains a coil spring 66 which is compressed when upper die plate 29 moves downwardly and as rod 60 engages surface 62. Upon removal of the magnetic force by removing the signal from the coil member 52, the spring bias of spring 66 causes the die upper plate 29 to return to its uppermost, equilibrium position.

Means for guiding the upper die plate 29 as it moves upwardly and downwardly includes a pair of tubular guides 70 adjacent to each power device 50, respectively. This is shown in FIG. 7 wherein each tubular guide 70 receives a follower member 72 having a ball bearing element 74 thereon to allow low friction movement of follower member 72 telescoped into a respective guide 70.

An outer frame 76 is rigidly secured to support 12 and extends upwardly therefrom to a location above upper die plate 29. Frame 76 has a fluid piston and cylinder assembly 78 thereon as shown in FIG. 6 and the lower end of the piston of the assembly 78 to is secured in any suitable manner to upper die plate 29. A lock 80 is provided to releasably lock the piston of assembly 78 to the upper die plate 29. Thus, when it is desired to elevate the upper die plate to replace or to inspect the blades 22, this can be done quickly and easily by elevating the upper die plate to a position well above its normal elevated, equilibrium position.

Figure 1:
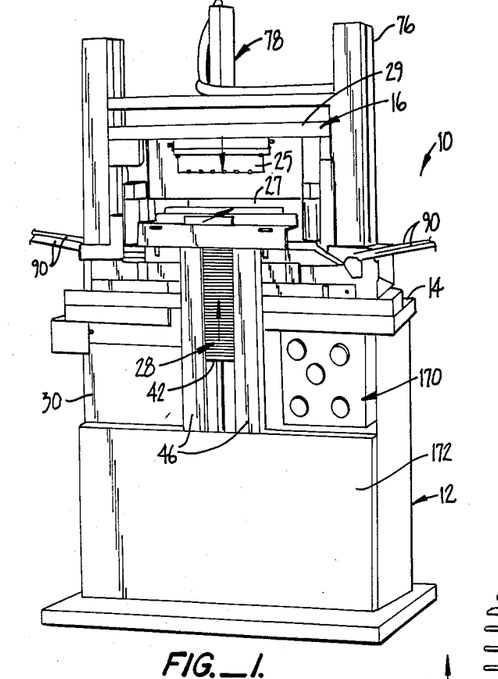
FIG. 1 is a perspective view of one side of the apparatus, showing the stack of semiconductor lead frames which are movable upwardly and then laterally into the space between a pair of dies for processing.
Figure 2:
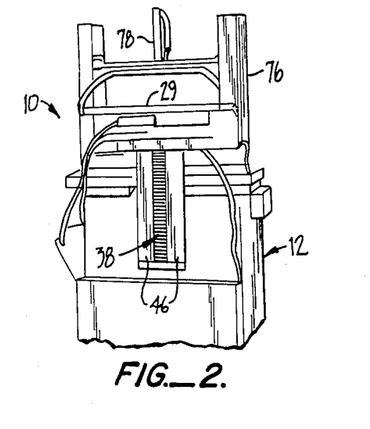
FIG. 2 is a view similar to FIG. 1 but showing the opposite side of the apparatus.

A shock absorbing system is provided for the upper die plate to damp out its vibrations when it moves upwardly following a deflashing operation. Thus, the upper die 25 will thereafter be ready immediately to move downwardly once again for the next deflashing operation. The shock absorbing system includes a pair of upright bars 90 on each end of upper die plate 29, respectively, bars 90 being pivotally secured at their lower ends by a pin 91 (FIG. 6) to a base plate 92 coupled with the corresponding power device 50. The guide bars 90 have a cross piece 94 (FIG. 5) at the upper ends thereof, and these cross pieces carry a pair of shock absorbers 96 thereon, each shock absorber 96 having a piston rod 98 (FIG. 6) which engages the upper surface 100 of the upper die plate 29. The shock absorbers are adjustable so that a predetermined downward bias can be exerted on the upper die plate to thereby control its uppermost equilibrium position. As the upper die plate rises, it engages and is damped by rods 98. The fact that the system is pivotal allows the upper die plate 29 to be freed so as to be quickly and easily elevated by the operation of piston and cylinder assembly 78 for replacement or inspection purposes as described above. Rods 90 are shown in FIG. 1 as being swung outwardly to free the upper die plate. Means including a block 105 (FIG. 7) is provided to releasably hold each pair of guide rods 90, respectively, in their uppermost positions.

A cable 106 (FIG. 6) is coupled to each power device respectively for supplying a signal to the corresponding core member 54 to thereby cause a magnetic force to be generated which attracts core 56 downwardly to thereby pull the upper die plate downwardly and the blades 22 into deflashing relationships with the lateral projections 24 on the lead frame 18 therebelow.

Shuttle member 35 is movable laterally of the sides of support 12 to shift the uppermost lead frame 18 off stack 28 and move it into a position between the upper and lower die plates 25 and 27. The shuttle member 35 remains stationary between the dies 25 and 27 during downward movement of the blades 31 as the blades to deflash the lead frame. Then, after the upper die plate has elevated, the shuttle member retracts to pick up the uppermost lead frame 18 in stack 28 and then moves forwardly again to position the picked-up lead frame 18 between the dies 25 and 27 for the next deflashing step. During the next forward movement, the lead frame 18 that was previously deflashed is advanced to an intermediate position upstream of a position overlying the stack 38 while the next uppermost lead frame from stack 28 is advanced into the next position underlying the reason for this is that the shuttle member cycles several times before a process (deflashed) lead frame 18 is moved into overlying relationship to stack 38 the upper die 25. The means for moving the shuttle member (FIG. 5) includes a fluid piston and cylinder assembly 110 which is carried by a rigid cross bar 112 spanning the distance between a pair of side brackets 114 rigid to support 12.

Figure 8:
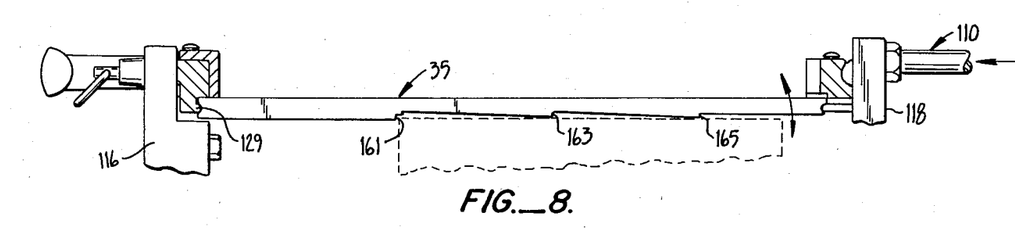
FIG. 8 is a cross-sectional view looking at the one side of the shuttle member.

The shuttle member includes a frame-like mount which includes a front crosspiece 116 (FIG. 9), a rear crosspiece 118 and a pair of side bars 120 (FIG. 12) connected to the front and rear crosspieces. The shuttle member further includes a number of bar devices 124 which span the distance between the front and rear crosspieces. Each bar device is comprised of a first bar 126 and a second bar 128 (FIG. 11), the bars in side by side relationship to each other. However, each bar 128 is fixed between front and rear crosspieces 116 and 118 but the other bar 126 can pivot about a horizontal axis defined by a rib 129 (FIG. 8) extending transversely along the front crosspiece 116 so that the rear end of each bar 126 can be raised slightly by a mechanism shown in FIG. 10. The purpose of raising the rear end of each bar 126 relative to the adjacent each bar 128 is to allow bar 126 to be retracted without engaging the housings 20 of the lead frame 18 therebelow so as not to scratch or otherwise damage such housings during the reverse movement of the shuttle bar. Since bars 126 are vertically aligned with and only slightly above grooves 27a (FIG. 6) of lower die 27, bars 126 must be raised to avoid engagement with housings 20 of lead frames 18 there below. The bars 128 are sufficiently high to clear the lead frame housings 20.

The means for lifting the bars 126 of the cross bar include a toothed member 143 having a plurality of teeth 145 and movable upwardly whereby the teeth of member 143 engage only the adjacent ends of the bars 126 to pivot them upwardly about rib 129. The way this is done is that each end of a toothed member 143 on shuttle member 35 has a vertical pin 145 (FIG. 10) provided with a roller 150 at the lower end thereof. The roller moves along a member 154 which is secured to a pair of air cylinders 156 secured to support 12. The air cylinders are carried by a support rail 158 and, when air is supplied to cylinders 154, member 154 is elevated, to raise the wheel which in turn raises pin 153 and thereby member 143, causing the teeth 145 thereof to engage the adjacent ends of the other bars 126 and pivot them upwardly. Then, the shuttle member is retracted to its reverse position and as it does so, the bars 126 move freely over housings 20 of the lead frame which has immediately been deflashed, thereby avoid scratching of the lead frame housing by the guide bar.

Figure 9:
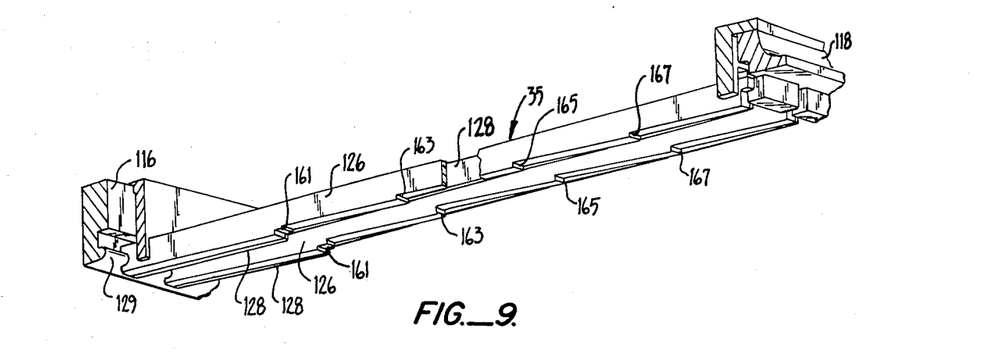
FIG. 9 is a fragmentary, perspective view of the shuttle member looking upwardly from the bottom thereof.
Figures 10, 11, 12:
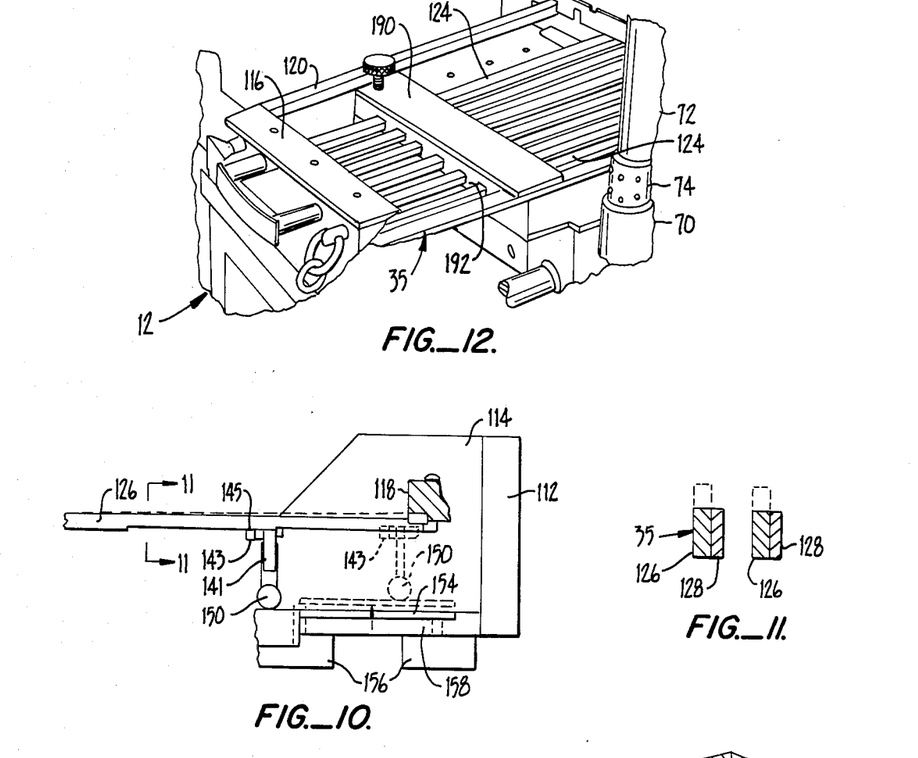
FIG. 10 is a fragmentary, vertical section through the shuttle member, showing the way in which each swingable bar of the shuttle member is elevated before it is retracted to permit it to avoid engagement with the molded semiconductor housings of the lead frames therebeneath.
FIG. 11 a cross sectional view taken along line 11—11 of FIG. 10.
FIG. 12 is a fragmentary, perspective view of the apparatus near the upper end of the upstream stack of lead frames.

Each bar 126 has a series of spaced notches on the bottom surface thereof. These notches are shown in FIGS. 9 and 10. A double or two-step notch 161 is provided near the end adjacent to rib 129 to engage the rear edges 20a (FIG. 3) of the uppermost lead frame 18 in stack 28 and move this lead frame in one direction toward and into a position between dies 25 and 27 during the second half of a cycle of movement of the shuttle member, the shuttle member moving in the opposite direction to place notches 161 of bars 126 in front of edges 28 of the uppermost lead frame 18 and stack 28. The two-step feature of notch 161 is to compensate for the offset between adjacent chip housings 20 (FIG. 3). Other notches 163, 165 and 167 are single step notches. These notches are adapted to engage respective housings 20 (FIG. 3) at the rear edges 20a, of processed lead frames 18 assuming that each lead frame 18 moves in the direction of arrow 21 (FIG. 3). Thus, processed lead frames 18 move incrementally toward stack 38, and since there are three sets of notches 163, 165 and 167, the shuttle member will cycle three times after a lead frame has been processed (deflashed) before that lead frame will move into alignment with stack 38 and fall by gravity therein.

The apparatus has control means generally denoted by the numeral 170 mounted on the front face 172 of support 12 for actuating the various devices and components which must be shifted sequentially to assure proper operation of apparatus 10.

In operation, a stack 28 of lead frames 18 is placed in the apparatus and the lead frames from stack 28 are processed one by one by apparatus 10. In a first step of the method of the present invention, shuttle member 35 is retracted fully to the left when viewing FIG. 5 under the influence of power device 110 and under the control of control means 170. Then, the shuttle member is shifted to the right when viewing FIG. 5 by the operation of fluid piston and cylinder assembly 110 and as the shuttle member moves to the right, the rearmost notch 161 (FIG. 8) of shuttle member 35 engages rear edges 20a of housings 20 of the topmost lead frame 18 (FIG. 3) and moves the lead frame from stack 28 laterally into a position between upper and lower dies 25 and 27, lower die 27 having guide grooves 27a (FIG. 6) for receiving housings 20 to guide the lead frame into the proper position. Also, lower die 27 has stop means (not shown) which prevents back-up of the lead frame at all times and also releasably prevents forward movement of the lead frame during processing such as deflashing.

When the lead frame is in the position between the dies 25 and 27, a signal is applied to each power device 50 by way of the respective cable 106 (FIG. 6), thus causing a magnetic force to be generated by the corresponding coil member 52 which attracts the corresponding core 56, pulling it downwardly and causing downward movement of upper die plate 29. This causes upper die 25 to move downwardly and causes blades 31 with teeth 26 thereon to shear off flashings 24 on housings 20 (FIG. 3). Then, the magnetic forces are removed from power devices 50, causing upper die plate to elevate to permit removal of the deflashed lead frame 18 and move the lead frame toward and into stack 38.

Figure 5:
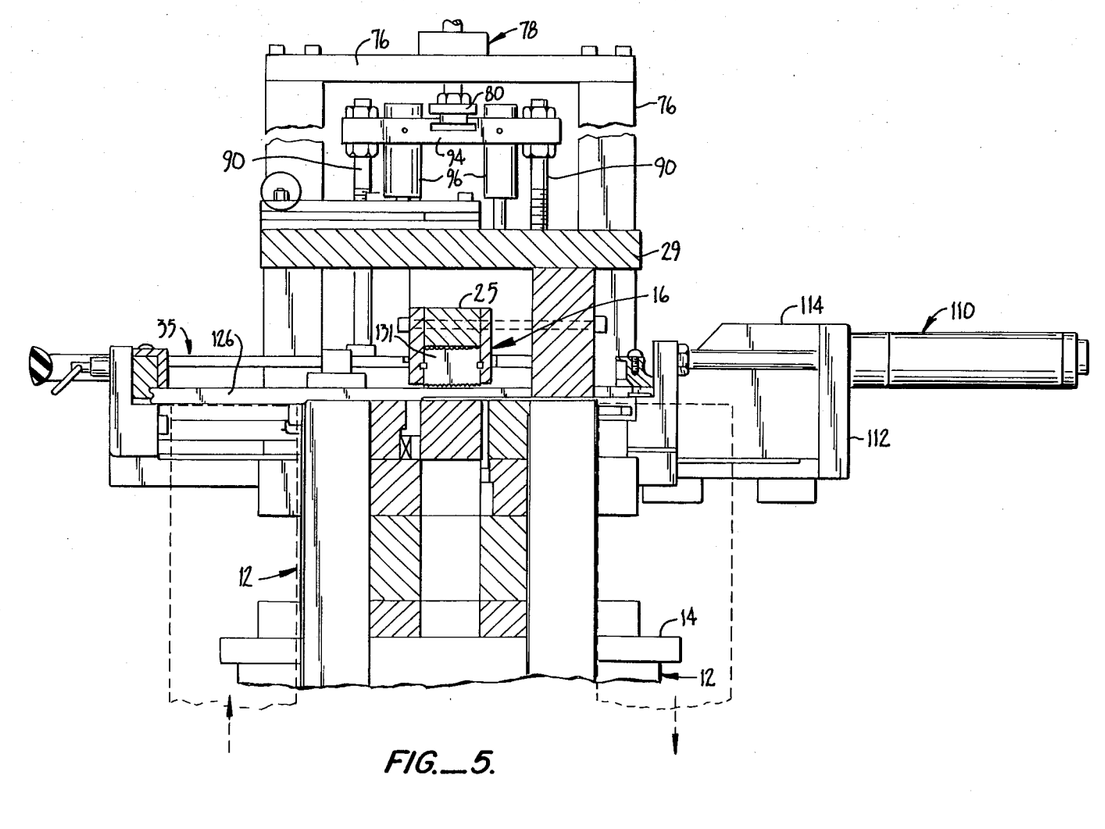
FIG. 5 is a vertical section of the apparatus looking in the direction from one side thereof.

To accomplish this latter step, shuttle member 35 is retracted once again, i.e., moved, to the left when viewing FIG. 5 by the operation of piston and cylinder assembly 110. As the shuttle member 35 shifts rearwardly, bars 126 thereof are raised by the upward movement of member 154 (FIG. 10) until the bars 126 are in the dashed line positions of FIG. 11. This is achieved when piston and cylinder assemblies 156 are energized to raise bar element 154 into the dashed line position, shown in FIG. 10, element 154 engaging roller 150 which is shown in FIG. 10 to the left of the position at which it normally would engage element 154. Roller 150 and pin 141 coupled thereto are carried by shuttle member 35 in any suitable manner and lift a toothed member 143 by pin 141, member 143 having a series of spaced teeth 145 for engaging adjacent ends of respective bars 126 to pivot the bars upwardly into the dashed position shown in FIG. 11 so that bars 126 will clear and not scratch housings 20 of lead frame 18 during reverse movement of shuttle member 35. Bars 128 adjacent to bars 126 do not pivot but do not engage housings 20 of the lead frame. Bars 128 are used to keep the lead frame from lifting relative to lower die 27.

Shuttle member 35 is provided with side guides 180 (FIG. 7) which slideably move relative to fixed guide rods 182 which are secured in any suitable manner to support 12. Thus, rods 182 form the tracks on which shuttle member 35 moves.

To prevent jamming of the uppermost lead frame in stack 28 (FIG. 3a), a fixed cross bar 190 is provided as shown in FIG. 12. Bar 190 has teeth 192 which fit between the bars 126 of shuttle member 35 to engage the upper lead frame 18 and prevent its further upward movement after it has been moved to a position adjacent to but spaced slightly below the bars of shuttle member 35.

The process of the present invention includes, therefore, the shifting of the uppermost lead frame 18 laterally from stack 28 into an operative position between dies 25 and 27 and then shifting the deflashed die toward stack 38. The process continues until all of the lead frames 18 in stack 28 have been processed and directed into stack 38. Then the stack 38 can be removed for further processing and new lead frames can be placed in stack 28 for continuation of the processing step.

While the present invention has been described as being operable to deflash lead frames 18, it also possible to perform other processing steps with apparatus 10, if desired. For instance, instead of or in addition to deflashing, the apparatus of the present invention could operate to remove the dam bars of the lead frames as well to bend their leads 22 into the proper shapes for use. Thus, the present invention is not limited to a particular type of processing although it is especially suitable for deflashing of semiconductor lead frames as above described.

I claim:

1. Apparatus for processing semiconductor lead frames comprising:
a support having first means on one side thereof for mounting a first stack of lead frames to be processed and second means on the opposite side thereof for receiving a second stack of lead frames after they have been processed;
means coupled with the first means for incrementally elevating a stack of lead frames, the second means being operable to allow processed lead frames to move into the second stack;

a pair of processing dies mounted near the upper end of the support, one of the dies being movable toward and away from the other die;

means coupled with said one die for shifting the same toward the other die to cause a lead frame in an operative position between the dies to be processed;

means mounted for reciprocation along a path extending between the dies for moving a lead frame from the first stack in one direction into said operative position between the dies for processing, said moving means being operable to advance a processed lead frame toward and into alignment with the second stack as said processed lead frame is moved in one direction, said moving means being movable in the opposite direction into a retracted position to place the moving means in position for shifting the uppermost lead frame of the first stack toward said operative position between; and means coupled with said moving means for reciprocating the latter with respect to said dies.

2. Apparatus as set forth in claim 1, wherein said one die is above the other die, there being a die plate coupled with said one die, said shifting means being coupled with the die plate.

3. Apparatus as set forth in claim 2, wherein said die plate has means for damping the vibration thereof as the die plate moves upwardly into position with the dies separated from each other.

4. Apparatus as set forth in claim 3, wherein said damping means includes a damper, and means pivotally mounting the damper on said support for movement into and out of a position engaging the die plate.

5. Apparatus as set forth in claim 1, wherein is included means on said support for lifting the die plate to a position above a normal equilibrium position thereof to permit access to the said one die on the upper die plate.

6. Apparatus as set forth in claim 1, wherein said shifting means includes a magnetically actuated device carried by the support and coupled with said one die.

7. Apparatus as set forth in claim 6, wherein said device includes a coil member on the support and having a recess provided with an open top, there being a die plate secured to said one die and disposed above the same, said die plate having a magnetic core member receivable in the recess of the coil member when a signal is applied to the coil member to generate a magnetic force exerted on the core in the direction of the recess.

8. Apparatus as set forth in claim 1, wherein is included track means removably coupled to each side, respectively, of the support for shiftably holding a stack of lead frames, whereby a stack of lead frames can be placed on and taken off the support.

9. Apparatus as set forth in claim 1, wherein the one die is above the other die, there being a die plate secured to said one die and including a guide means for guiding the die plate as it moves up and down with respect to the other die, and shock absorbing means coupled with the upper die plate for damping the vibrations thereof as it approaches its upper equilibrium position.

10. Apparatus as set forth in claim 9, wherein is included means on said support for elevating the die plate above its equilibrium position to permit access to the die thereon.

11. Apparatus as set forth in claim 9, wherein is included means on said die plate elevating for locking said means to the die plate.

12. Apparatus as set forth in claim 1, wherein the shifting means includes a shuttle member having a plurality of generally parallel shuttle bars, each shuttle bar having means on the lower surface thereof for engaging and moving a lead frame from a position aligned with the top of the first stack to a position at the top of the second stack.

13. Apparatus as set forth in claim 12, wherein said means on the lower surface of each shuttle bar includes means defining a notch formed on said lower surface.

14. Apparatus as set forth in claim 12, wherein each shuttle bar is pivotally mounted adjacent to one end thereof for movement of the other end upwardly and downwardly to permit clearance of the shuttle bar relative to an adjacent lead frame when the shuttle bar moves in one direction, and means coupled with the shuttle member for lifting the ends of the shuttle bars.

15. Apparatus as set forth in claim 14, wherein said lifting means includes a fluid piston and cylinder assembly and a first bar secured to the assembly, and a lifting bar having teeth thereon for engaging the lower surface of the end of each shuttle bar, respectively, and a pin movable over the first bar, said pin having a lower end thereof for rolling engagement with the lifting bar, said pin being operable to lift the toothed element when the fluid piston and cylinder assembly is actuated.

16. A method of processing a plurality of semiconductor lead frames comprising:

moving the uppermost lead frame laterally off a first stack of lead frames and into a processing zone;

processing the first lead frame in said zone;

advancing said first frame to a position toward a second stack of lead frames, whereby the first lead frame can gravitate into the second stack when it becomes aligned therewith; and repeating the moving, processing and advancing steps until all of the lead frames from the first stack have been processed and have been placed in the second stack.

* * * * *